(12) United States Patent
Yamada (10) Patent No.: US 8,476,680 B2
(45) Date of Patent: Jul. 2, 2013

(54) SEMICONDUCTOR DEVICE AND METHOD FOR MANUFACTURING THE SAME

(75) Inventor: Takayuki Yamada, Toyama (JP)

(73) Assignee: Panasonic Corporation, Osaka (JP)

( * ) Notice: Subject to any disclaimer, the term of this patent is extended or adjusted under 35 U.S.C. 154(b) by 204 days.

(21) Appl. No.: 13/029,556

(22) Filed: Feb. 17, 2011

(65) Prior Publication Data
US 2011/0284935 A1    Nov. 24, 2011

(30) Foreign Application Priority Data

May 21, 2010 (JP) ................. 2010-117028

(51) Int. Cl.
*H01L 29/76* (2006.01)
(52) U.S. Cl.
USPC ........... 257/213; 257/382; 257/383; 257/384; 257/E21.626; 257/E21.64; 257/E21.19
(58) Field of Classification Search
None
See application file for complete search history.

(56) References Cited

U.S. PATENT DOCUMENTS

| | | | | |
|---|---|---|---|---|
| 5,716,862 A | * | 2/1998 | Ahmad et al. | 438/303 |
| 6,362,062 B1 | * | 3/2002 | Nandakumar | 438/303 |
| 2002/0079492 A1 | | 6/2002 | Koga | |
| 2005/0035470 A1 | | 2/2005 | Ko et al. | |
| 2007/0034963 A1 | | 2/2007 | Sudo | |
| 2007/0096184 A1 | | 5/2007 | Akamatsu | |
| 2007/0102726 A1 | * | 5/2007 | Watanabe et al. | 257/194 |
| 2007/0196972 A1 | | 8/2007 | Shima | |
| 2009/0020828 A1 | | 1/2009 | Yamada | |
| 2010/0047978 A1 | | 2/2010 | Tamura | |

FOREIGN PATENT DOCUMENTS

| JP | 11-238879 A | 8/1999 |
|---|---|---|
| JP | 2003-077936 A | 3/2003 |
| JP | 2007-49166 | 2/2007 |
| JP | 2007-207816 A | 8/2007 |

* cited by examiner

*Primary Examiner* — Fei Fei Yeung Lopez
(74) *Attorney, Agent, or Firm* — McDermott Will & Emery LLP (57) ABSTRACT

A semiconductor device includes: a semiconductor substrate; a gate electrode formed on the semiconductor substrate with a gate insulating film interposed therebetween; a side wall spacer formed on a side wall of the gate electrode; source/drain regions formed in opposing portions of the semiconductor substrate with the gate electrode and the side wall spacer interposed therebetween; and a stress-applying insulating film covering the gate electrode, the side wall spacer, and an upper surface of the semiconductor substrate. A gate-length-direction thickness of an upper portion of the side wall spacer is at least larger than a gate-length-direction thickness of a middle portion thereof.

18 Claims, 6 Drawing Sheets

SEMICONDUCTOR DEVICE AND METHOD FOR MANUFACTURING THE SAME

CROSS-REFERENCE TO RELATED APPLICATION

This application claims priority from Japanese Patent Application JP2010-117028 filed on May 21, 2010, the disclosure of which application is hereby incorporated by reference into this application in its entirety for all purposes.

BACKGROUND

The present disclosure relates to a semiconductor device including a stress-applying insulating film therein, and a method for manufacturing the same.

In order to realize the increase in speed required for semiconductor integrated circuits in recent years, there have been attempts to improve the carrier mobility through the channel region by coating a metal insulator semiconductor field effect transistor (MISFET) with a stress-applying insulating film. In order to improve the electron mobility through the channel region of an N-type MISFET, a stress-applying insulating film that gives the channel region a tensile stress in the channel length direction (the direction parallel to the direction in which carriers flow between the source and the drain) is used. In order to improve the hole mobility through the channel region of a P-type MISFET, a stress-applying insulating film that gives the channel region a compressive stress in the channel length direction is used.

In order to effectively improve the mobility with these stress-applying insulating films, it is preferred that a stress-applying insulating film is placed near the channel region. An example of such a semiconductor device is disclosed in Japanese Published Patent Application No. 2007-49166.

Figure 6A:
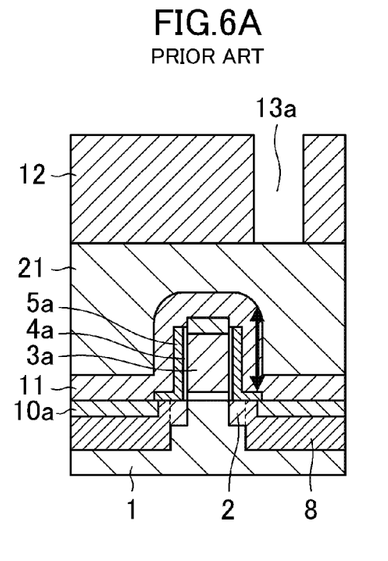
FIGS. 6A and 6B are cross-sectional views showing a conventional semiconductor device.
Figure 6B:
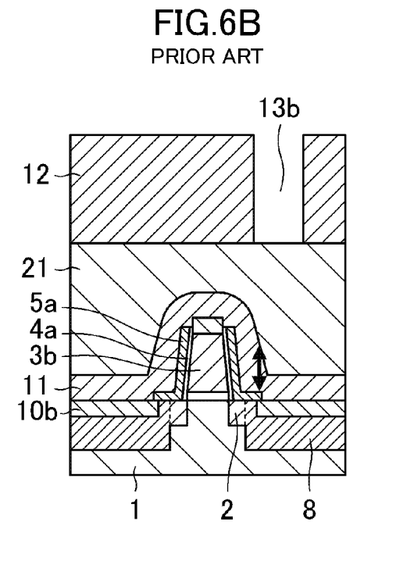

FIGS. 6A and 6B are cross-sectional views showing a conventional semiconductor device. As shown in FIG. 6A, a conventional semiconductor device includes a MISFET provided on a semiconductor substrate 1. The MISFET includes a gate electrode 3a on a gate insulating film, a side wall spacer 4a, a side wall spacer 5a, a deep source/drain region 8, and a silicide layer 10a. A stress-applying insulating film 11 and an interlayer insulating film 21 are also provided.

SUMMARY

While a silicon nitride film is typically used as a stress-applying insulating film, this film is used as an etching stopper layer during a dry etching step for forming contact holes in the interlayer insulating film. Particularly, where the side wall of the gate electrode 3a is perpendicular to the upper surface of the semiconductor substrate as shown in FIG. 6A, even if a mask (a resist 12) is misaligned in the lithography step for forming contact holes so that the position of a contact hole is shifted toward the gate electrode 3a and is partially off the silicide 10a, it is less likely that the semiconductor substrate 1 is overly etched. This is because of the large vertical thickness of the stress-applying insulating film 11 which is provided under one side of an opening 13a of the resist 12 that is closer to the gate electrode 3a, i.e., the stress-applying insulating film 11 formed on the vertical side wall of the gate electrode 3a.

However, the gate electrode may have a tapered shape as does a gate electrode 3b, depending on the conditions when forming the gate electrode, as shown in FIG. 6B. If the mask is misaligned in such a case, the vertical thickness of the stress-applying insulating film 11 located under a resist opening 13b, i.e., the stress-applying insulating film 11 formed on the tapered side wall of the gate electrode 3a, is smaller than that in a case shown in FIG. 6A. Therefore, the contact plug is formed at a position off a silicide layer 10b and is in contact with an extension region 2. This leads to problems such as an increase in the leak current or an increase in the contact resistance, thus lowering the production yield.

With a semiconductor device according to an embodiment of the present invention, it is possible to reduce the increase in the leak or the contact resistance due to misalignment during the contact hole formation process.

A semiconductor device according to an example of the present invention includes: a semiconductor substrate; a gate electrode formed on the semiconductor substrate with a gate insulating film interposed therebetween; a side wall spacer formed on a side wall of the gate electrode; source/drain regions formed in opposing portions of the semiconductor substrate with the gate electrode and the side wall spacer interposed therebetween; and a stress-applying insulating film covering the gate electrode, the side wall spacer, and an upper surface of the semiconductor substrate. A gate-length-direction thickness of an upper portion of the side wall spacer in a height direction is at least larger than a gate-length-direction thickness of a middle portion thereof in the height direction.

With this configuration, the thickness of the side wall spacer is larger in the upper portion than in the middle portion. Therefore, even if the gate electrode has a tapered shape, for example, it is possible to ensure that the stress-applying insulating film has a sufficient thickness in the height direction when forming contact holes. As a result, even if a mask is misaligned when forming the contact holes so that the position of a contact plug is partially off the silicide layer, it is possible to reduce the increase in the leak current or the increase in the contact resistance. Therefore, it is possible to reduce the decrease in the production yield of the semiconductor device or the increase in the power consumption.

A method for manufacturing a semiconductor device according to an example of the present invention includes the steps of: (a) forming a gate electrode on a semiconductor substrate with a gate insulating film interposed therebetween; (b) forming a first side wall portion having an L-shaped cross section on the side wall of the gate electrode and on the semiconductor substrate, and forming a dummy side wall portion on the side wall of the gate electrode and on the semiconductor substrate with the first side wall portion interposed therebetween; (c) forming a depressed portion in an upper end portion of the first side wall portion by removing at least an upper portion of the first side wall portion located between the gate electrode and the dummy side wall portion, wherein an inner wall surface of the depressed portion includes the dummy side wall portion, the gate electrode and the first side wall portion; (d) forming a second side wall portion filling the depressed portion; (e) forming a side wall spacer including the first side wall portion and the second side wall portion by selectively removing the dummy side wall portion; and (f) forming a stress-applying insulating film covering the gate electrode, the side wall spacer and an upper surface of the semiconductor substrate.

With this method, the thickness of the upper portion of the side wall spacer can be made larger than that of the middle portion thereof by burying the second side wall portion in the depressed portion. Therefore, it is possible to ensure that the stress-applying insulating film has a sufficient thickness in the height direction when forming contact holes. Therefore, with this method, it is possible to manufacture a semiconductor device with reduced power consumption with high production yield.

As described above, with the semiconductor device according to an example of the present invention and a method for manufacturing the same, even if a mask is misaligned when forming contact holes so that the position of a contact plug is off the silicide layer, it is possible to reduce the increase in the leak current or the increase in the resistance, and it is possible to provide a semiconductor device with reduced power consumption with high production yield.

DETAILED DESCRIPTION

Embodiment

A semiconductor device of an embodiment of the present invention and a method for manufacturing the same will now be described with reference to the drawings.

FIGS. 1A-1F and 2A-2F are cross-sectional views showing a method for manufacturing a semiconductor device according to one example of the embodiment of the present invention.

Figures 1A, 1D:
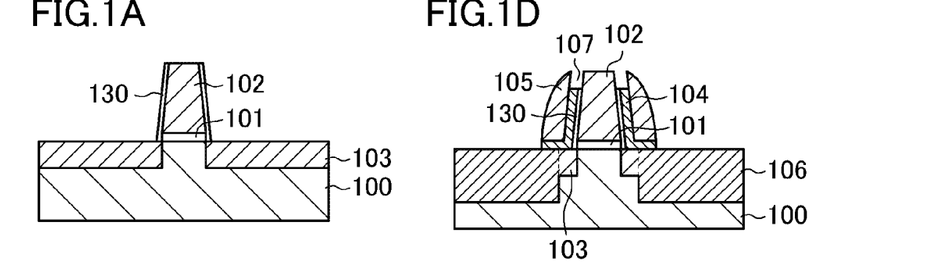
FIGS. 1A-1F are cross-sectional views showing a method for manufacturing a semiconductor device according to one example of an embodiment of the present invention.

First, as shown in FIG. 1A, a gate insulating film 101 and a gate electrode 102 having a height of 100 nm are formed on a semiconductor substrate 100 made of silicon, or the like. Here, the taper angle of the gate electrode 102 is 88°, for example, and the upper-end position of the side wall of the gate electrode 102 is about 3 nm inward from the lower-end position of the side wall. Note that the width of the lower end (gate length) of the gate electrode 102 is about 40 nm, for example.

Next, a side wall portion 130 having an I-shaped cross section and a thickness of about 5 nm is formed on the side wall of the gate electrode 102. The side wall portion 130 is an offset spacer, and may be formed by silicon nitride (e.g., a silicon nitride film) though it is assumed to be silicon oxide (e.g., a silicon oxide film) in the present embodiment.

Next, an n-type impurity ion such as arsenic (As) is implanted into an upper portion of the semiconductor substrate 100 using the gate electrode 102 and the side wall portion 130 as a mask, thereby forming an n-type shallow source/drain region 103. The ion implantation is performed with, for example, a dose of $1\times10^{15}$ cm$^{-2}$ and an implantation energy of 2 keV.

Figures 1B, 1E:
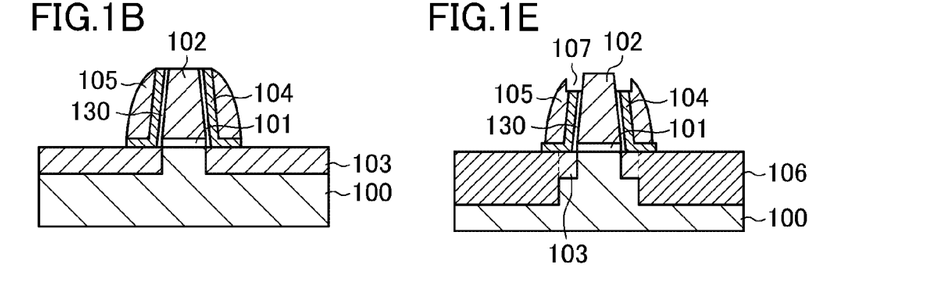

Next, as shown in FIG. 1B, silicon oxide (e.g., a silicon oxide film) whose thickness is 10 nm, for example, and silicon nitride (e.g., a silicon nitride film) whose thickness is 40 nm, for example, are deposited in this order on the semiconductor substrate 100 and on the gate electrode 102. Then, portions of these films are removed by anisotropic dry etching, thereby forming a side wall portion 104 made of silicon oxide and having an L-shaped cross section on the side wall of the gate electrode 102 with the side wall portion 130 interposed therebetween, and a side wall portion 105 formed on the side wall of the gate electrode 102 and the upper surface of the semiconductor substrate 100 with the side wall portion 104 interposed therebetween. The side wall portion 105 may be formed by a material having an etching selectivity with respect at least to the side wall portion 104, and is herein formed by silicon nitride.

Figures 1C, 1F:
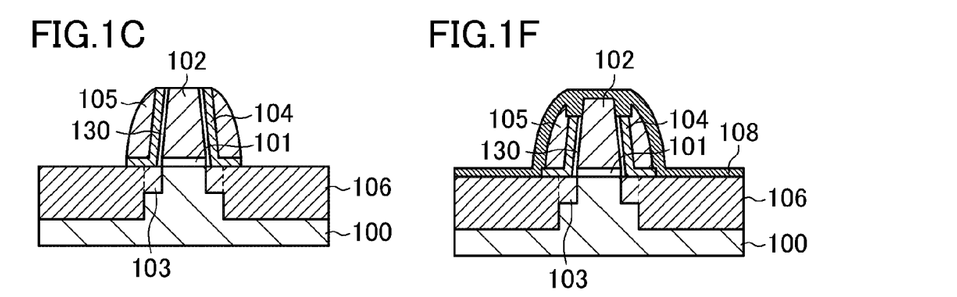

Next, as shown in FIG. 1C, an n-type impurity ion such as As is implanted using the gate electrode 102 and the side wall portions 130, 104 and 105 as a mask, thereby forming a deep n-type source/drain region 106 in portions of the semiconductor substrate 100 on opposite sides of the gate electrode 102 and the side wall portions 130, 104 and 105. The dose of ion implantation is about $5\times10^{15}$ cm$^{-2}$, for example, and the implantation energy is about 10 keV, for example.

Next, as shown in FIG. 1D, an upper portion of the side wall portion 104 located between the gate electrode 102 and the side wall portion 105 is removed by about 10 nm by dry etching. Thus, a depressed portion 107 is formed in the upper end portion of the side wall portion 104, of which the inner wall surface is formed by the side wall portion 105, the gate electrode 102 and the side wall portion 104. If the side wall portion 130 is of the same silicon oxide as the side wall portion 104, the upper portion of the side wall portion 130 is also removed by about 10 nm by dry etching as is the upper portion of the side wall portion 104. Note that it may not be necessary to remove the upper portion of the side wall portion 130, and if a different silicon nitride from that of the side wall portion 104 is used as the side wall portion 130, the inner wall surface of the depressed portion 107 is formed by the side wall portion 105, the side wall portion 130 and the side wall portion 104. The upper portion of the side wall portion 104 may be removed by wet etching instead of dry etching. In such a case, a portion of the side wall portion 130 that is sandwiched between the side wall portion 105 and the semiconductor substrate 100 is also partly removed.

Next, as shown in FIG. 1E, the exposed portion of the side wall portion 105 is etched by about 3 nm using an ammonia hydrogen peroxide mixture (APM). Thus, the side wall portion 105 forming the side wall of the depressed portion 107 is etched back by about 3 nm, thus increasing the width of the depressed portion 107.

Next, as shown in FIG. 1F, silicon oxide (e.g., a silicon oxide film) 108 whose thickness is about 8 nm is formed by a chemical vapor deposition (CVD) method, or the like, across the entire surface of the semiconductor substrate 100 including the gate electrode 102 and the side wall portion 105.

Figure 2A:
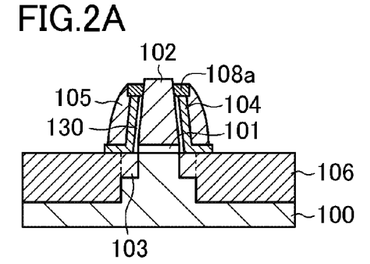
FIGS. 2A-2F are cross-sectional views showing the method for manufacturing a semiconductor device according to one example of an embodiment of the present invention.

Next, as shown in FIG. 2A, the silicon oxide 108 is removed by anisotropic etching, leaving a side wall portion 108a made of silicon oxide in the depressed portion. Note that the silicon oxide 108 can also be used as a mask in the silicide step. In such a case, the silicon oxide 108 is left unremoved on an MIS transistor in which no silicide layer is formed on the gate electrode and on the deep source/drain region.

Figure 2B:
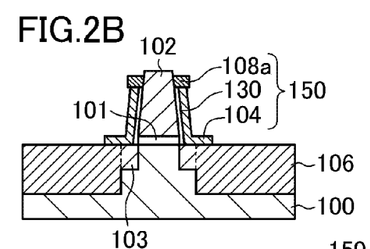

Next, as shown in FIG. 2B, the side wall portion 105 made of silicon nitride is removed by using hot phosphoric acid. Here, the thickness (the thickness in the gate length direction) of the side wall portion 108a provided on the upper end portion of the side wall portion 104 is at least greater than the thickness of the middle portion of the side wall portion 104 in the height direction. That is, the thickness in the height direction of the upper portion of a side wall spacer 150, formed by the side wall portions 104, 108a and 130, is greater than the thickness of the middle portion of the side wall spacer 150. Here, the middle portion of the side wall portion 104 in the height direction means the vicinity of about one half of the total height of the portion of the side wall portion 104 formed along the side wall of the gate electrode 102. The side wall portion 105 is a dummy side wall portion that is removed after the side wall portion 108a is formed and is not left present in the final structure.

Figure 2C:
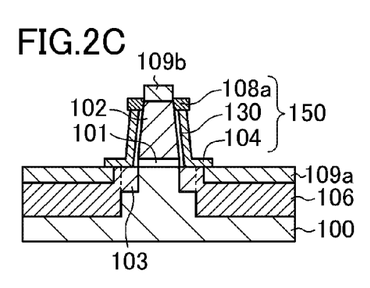

Next, as shown in FIG. 2C, using the side wall spacer 150 as a mask, a silicide layer 109a made of nickel silicide is formed on the deep source/drain region 106, and a silicide layer 109b made of nickel silicide is formed on the gate electrode 102. In this process, the structure is formed so that the end portion of the silicide layer 109a closer to the gate electrode 102 is, for example, 2 nm inward (toward the gate electrode 102) from the end portion of the side wall spacer 150 (the side wall portion 104).

Figure 2D:
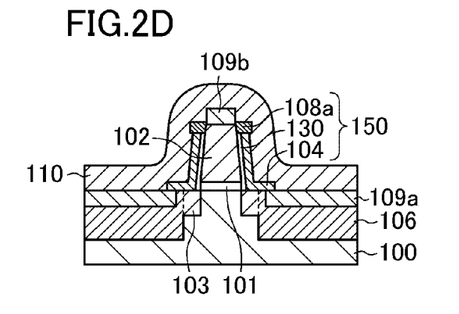

Next, as shown in FIG. 2D, a stress-applying insulating film 110 made of silicon nitride (e.g., a silicon nitride film) whose thickness is about 40 nm is deposited across the entire surface on the semiconductor substrate 100 so as to cover the gate electrode 102 and the side wall spacer 150. Here, the stress-applying insulating film 110 is formed so as to be in contact with the surface of the side wall portion 104 that is curved in an L shape, and applies a tensile stress in the channel length direction upon the channel region formed in a portion of the semiconductor substrate 100 directly under the gate electrode 102. This improves the mobility of the N-type MISFET.

Figure 2E:
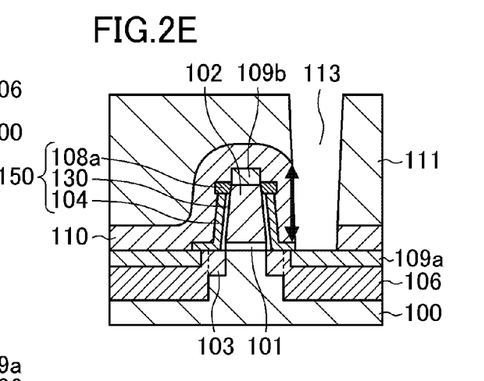

Next, as shown in FIG. 2E, an interlayer insulating film 111 made of silicon oxide is formed on the gate electrode 102 and on the semiconductor substrate 100, and then a contact hole 113 is formed in the interlayer insulating film 111 reaching the silicide layer 109a by dry etching using a patterned resist. In this process, first, the interlayer insulating film 111 is etched using the stress-applying insulating film 110 as an etching stopper, and then the stress-applying insulating film 110 is etched. Thereafter, the resist is peeled off.

Figure 2F:
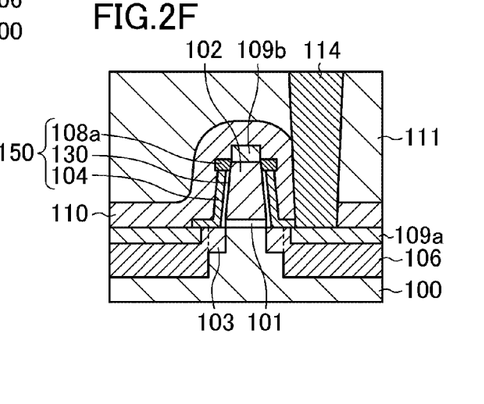

Next, as shown in FIG. 2F, a metal such as tungsten is buried in the contact hole 113 by a known method, thereby forming a contact plug 114 connected to the silicide layer 109a.

The thickness of the side wall portion 108a formed by the above method can be larger than the total thickness of the side wall portion 104 and the side wall portion 130 at least by 3 nm or more. Therefore, even if the resist opening position is shifted toward the gate electrode 102 from the predetermined position when forming the contact hole 113, the thickness of the stress-applying insulating film 110 in the height direction can be made sufficient as an etching stopper. Therefore, where the gate electrode 102 is tapered, even if the mask is misaligned in the lithography step when forming the contact hole, it is possible to reduce the amount of the semiconductor substrate 100 to be overly etched in the dry etching step. Even if the position of the resist is shifted from the silicide layer 109a, it is possible to prevent the contact hole 113 from being formed on the shallow source/drain region 103, and to reduce an increase in the contact resistance. As described above, with the manufacturing method of the present embodiment, even if the position of the contact plug 114 is shifted, it is possible to reduce the occurrence of problems such as an increase in the leak current or an increase in the resistance, and it is possible to manufacture a semiconductor device with low power consumption with high production yield.

As shown in FIG. 2F, a semiconductor device manufactured by the above method includes the semiconductor substrate 100, the gate electrode 102 formed on the semiconductor substrate 100 with the gate insulating film 101 interposed therebetween, the side wall spacer 150 formed on the side wall of the gate electrode 102, the deep source/drain regions 106 formed in opposing portions of the semiconductor substrate 100 with the gate electrode 102 and the side wall spacer 150 interposed therebetween, and the stress-applying insulating film 110 covering the gate electrode 102, the side wall spacer 150 and the upper surface of the semiconductor substrate 100. The thickness of an upper portion of the side wall spacer 150 in the height direction is at least larger than the thickness of the middle portion thereof in the height direction.

Thus, the surface of the stress-applying insulating film 110 (the surface running in parallel to the side wall of the gate electrode 102) formed on the side wall of the gate electrode 102 with the side wall spacer 150 interposed therebetween is substantially perpendicular to the surface of the semiconductor substrate 100. Therefore, the taper angle of the surface of the stress-applying insulating film 110 formed on the side wall of the gate electrode 102 is larger than the taper angle of the gate electrode 102, and where the taper angle of the gate electrode 102 is 88°, for example, the taper angle of the surface of the stress-applying insulating film 110 is substantially 90°.

The side wall spacer 150 is formed on the side wall of the gate electrode 102 and on the semiconductor substrate 100, and includes the side wall portion 104 having an L-shaped cross section, and the side wall portion 108a formed on the upper end portion of the side wall portion 104 and having a thickness at least larger than the thickness of the side wall portion 104 (the middle portion thereof).

The gate electrode 102 has a tapered shape such that the angle of the side wall with respect to the upper surface of the semiconductor substrate 100 is 88°, for example. Note that the taper angle is not limited to this.

With the method of the present embodiment, since the silicon oxide formed as the protection mask for the non-silicide region in the step of forming the silicide layers 109a and 109b can be used as the silicon oxide 108 forming the side wall portion 108a, the number of steps is not increased as compared with the method for manufacturing a conventional semiconductor device.

Note that while the present embodiment is directed to an example where the side wall portion 130 is formed on the side wall of the gate electrode 102 in the step shown in FIG. 1A, the side wall portion 130 is not necessary, and may be absent.

Note that in the method of the present embodiment, the silicide layers 109a and 109b may be formed after the formation of the side wall portion 108a and before the removal of the side wall portion 105.

While the present embodiment is directed to an example where the MISFET is of an n-channel type, the MISFET may be of a p-channel type, and the shallow source/drain region 103 and the deep source/drain region 106 may be of a p type. In such a case, the stress-applying insulating film 110 is formed so as to apply a compressive stress in the channel length direction upon the channel region.

—Semiconductor Device of First Variation—

Figure 3:
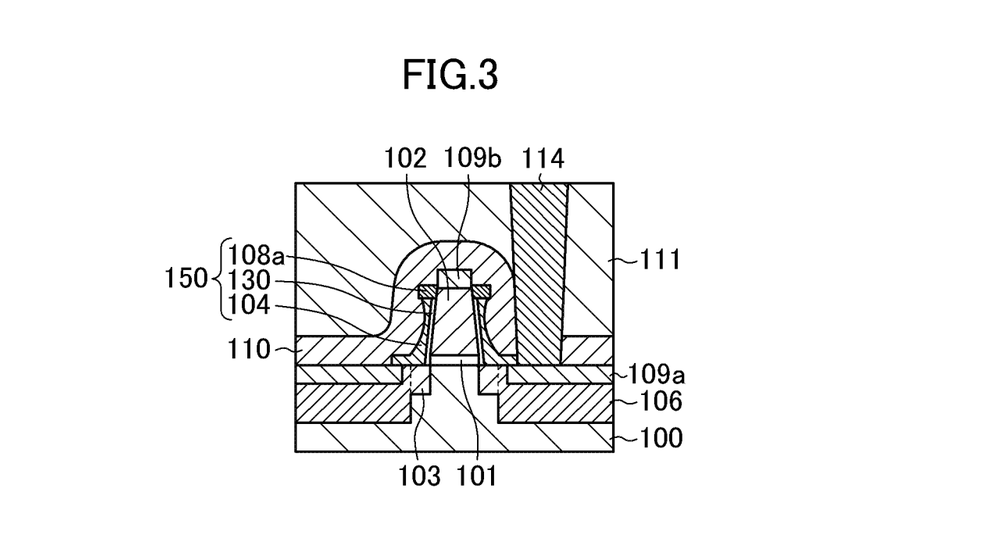
FIG. 3 is a cross-sectional view showing a semiconductor device according to a first variation of the embodiment of the present invention.

FIG. 3 is a cross-sectional view showing a semiconductor device according to a first variation of the embodiment of the present invention.

As shown in the figure, the semiconductor device of this variation includes the semiconductor substrate 100, the gate electrode 102 formed on the semiconductor substrate 100 with the gate insulating film 101 interposed therebetween, the side wall spacer 150 formed on the side wall of the gate electrode 102, the deep source/drain region 106 formed in opposing portions of the semiconductor substrate 100 with the gate electrode 102 and the side wall spacer 150 interposed therebetween, and the stress-applying insulating film 110 covering the gate electrode 102, the side wall spacer 150 and the upper surface of the semiconductor substrate 100. The thickness of an upper portion of the side wall spacer 150 in the height direction is at least larger than the thickness of the middle portion thereof in the height direction.

The side wall spacer 150 includes the side wall portion 104 formed on the side wall of the gate electrode 102 and on the semiconductor substrate 100 and having an L-shaped cross section, and the side wall portion 108*a* formed on the side wall portion 104 and having a thickness that is at least larger than that of the middle portion of the side wall portion 104 in the height direction.

Here, the semiconductor device of this variation differs from the semiconductor device shown in FIG. 2F in that the portion of the side wall spacer 150 that is in contact with the side wall of the gate electrode 102 has a thickness that increases from the middle portion toward the lower portion in the height direction. More specifically, the portion of the side wall portion 104 that is in contact with the side wall of the gate electrode 102 has a thickness that increases from the middle portion toward the lower portion in the height direction.

Also in this case, as with the semiconductor device of the present embodiment, it is possible to prevent the contact hole 113 from being formed on the shallow source/drain region 103, and it is possible to reduce the increase in the contact resistance. Even if the position of the contact plug 114 is shifted, it is possible to reduce the occurrence of problems such as an increase in the leak current or an increase in the resistance, and it is possible to manufacture a semiconductor device with low power consumption with high production yield.

—Semiconductor Device of Second Variation—

A method for manufacturing a semiconductor device according to a second variation of the embodiment of the present invention will be described with reference to the drawings. FIGS. 4A-4F and 5A-5E are cross-sectional views showing a method for manufacturing the semiconductor device of the second variation.

Figure 4A:
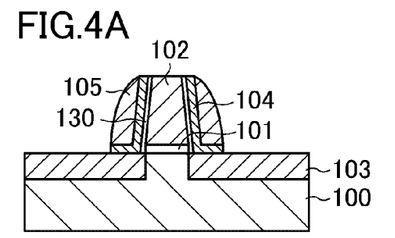
FIGS. 4A-4F are cross-sectional views showing a method for manufacturing a semiconductor device according to a second variation.

First, as shown in FIG. 4A, the gate insulating film 101 and the gate electrode 102 having a height of 100 nm are formed on the semiconductor substrate 100 made of silicon, or the like. Here, the taper angle of the gate electrode 102 is 89°, for example, and the upper-end position of the side wall of the gate electrode 102 is about 2 nm inward from the lower-end position of the side wall. Note that the width of the lower end of the gate electrode 102 is about 40 nm, for example.

Next, the side wall portion 130 having a thickness of about 5 nm is formed on the side wall of the gate electrode 102.

Next, an n-type impurity ion is implanted into an upper portion of the semiconductor substrate 100 using the gate electrode 102 and the side wall portion 130 as a mask, thereby forming the shallow source/drain region 103. The ion implantation conditions are the same as those of the step shown in FIG. 1A.

Next, silicon oxide whose thickness is 10 nm, for example, and silicon nitride whose thickness is 40 nm, for example, are deposited in this order on the semiconductor substrate 100 and on the gate electrode 102. Then, portions of these films are removed by anisotropic dry etching, thereby forming the side wall portion 104 made of silicon oxide and having an L-shaped cross section on the side wall of the gate electrode 102, and the side wall portion 105 formed on the side wall of the gate electrode 102 and the upper surface of the semiconductor substrate 100 with the side wall portion 104 interposed therebetween.

Figure 4B:
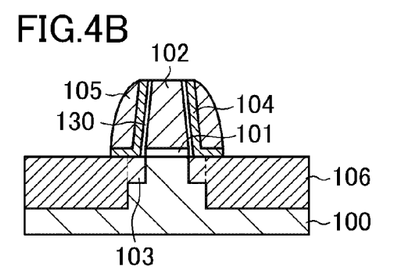

Next, as shown in FIG. 4B, an n-type impurity ion such as As is implanted using the gate electrode 102 and the side wall portions 130, 104 and 105 as a mask, thereby forming the deep source/drain region 106 in portions of the semiconductor substrate 100 on opposite sides of the gate electrode 102 and the side wall portions 130, 104 and 105. The ion implantation conditions are the same as those of the step shown in FIG. 1C.

Figure 4C:
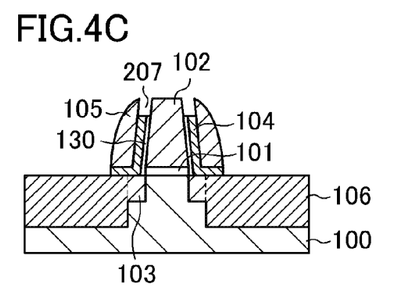

Next, as shown in FIG. 4C, an upper portion of the side wall portion 104 is removed by about 10 nm by dry etching. Thus, a depressed portion 207 is formed in the upper end portion of the side wall portion 104, of which the inner wall surface is formed by the side wall portion 105, the gate electrode 102 and the side wall portion 104. If the side wall portion 130 is of the same silicon oxide as the side wall portion 104, the upper portion of the side wall portion 130 is also removed by about 10 nm by dry etching as is the upper portion of the side wall portion 104. Note that it may not be necessary to remove the upper portion of the side wall portion 130, and if a different silicon nitride from that of the side wall portion 104 is used as the side wall portion 130, the inner wall surface of the depressed portion 207 is formed by the side wall portion 105, the side wall portion 130 and the side wall portion 104. The upper portion of the side wall portion 104 may be removed by wet etching instead of dry etching. In such a case, a portion of the side wall portion 104 that is sandwiched between the side wall portion 105 and the semiconductor substrate 100 is also partly removed. The steps thus far are similar to those shown in FIGS. 1A-1D.

Figure 4D:
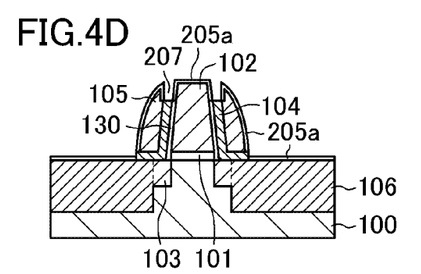

Next, an oxidized layer 205*a* having a thickness of about 2 nm is formed on the surface of the side wall portion 104 by oxidizing the exposed portion of the side wall portion 104 by exposing the portion to an oxygen plasma, for example. Here, the oxidized layer 205*a* is formed also on the upper surface of the semiconductor substrate 100 and on the exposed portion of the gate electrode 102.

Figure 4E:
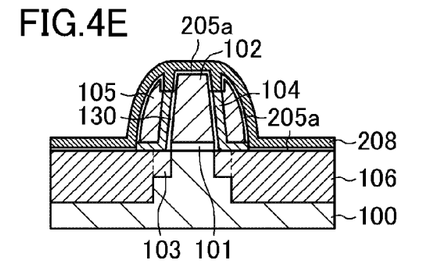

Next, as shown in FIG. 4E, silicon oxide 208 whose thickness is about 8 nm is formed by a CVD method on the gate electrode 102, on the side wall portion 105 and on the semiconductor substrate 100.

Figure 4F:
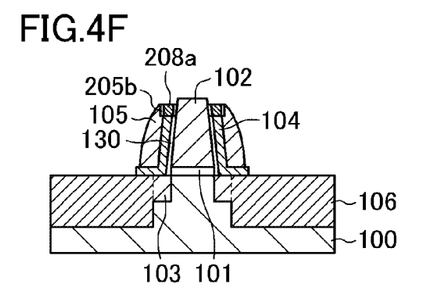

Next, as shown in FIG. 4F, portions of the silicon oxide 208 and the oxidized layer 205*a* are removed by wet etching, thereby forming, in the depressed portion 207, a side wall portion 208*a* which is a part of the silicon oxide 208, and a side wall portion 205*b* which is a part of the oxidized layer 205*a* formed on the side surface of the side wall portion 208*a*. Note that portions of the silicon oxide 208 and the oxidized layer 205*a* may be removed by dry etching instead of wet etching.

Figure 5A:
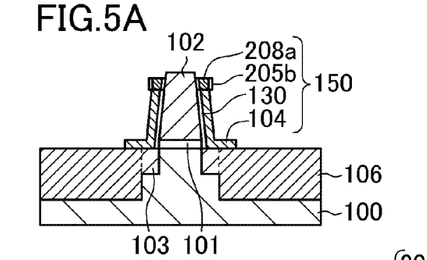
FIGS. 5A-5E are cross-sectional views showing the method for manufacturing a semiconductor device according to the second variation.

Next, as shown in FIG. 5B, the side wall portion 105 made of silicon nitride is removed by using hot phosphoric acid. Here, the total thickness of the side wall portion 208*a* and the side wall portion 205*b* provided on the side wall portion 104 is at least larger than the thickness of the middle portion of the side wall portion 104 in the height direction. That is, the thickness of the upper portion of the side wall spacer 150 in the height direction, including the side wall portions 104, 205*b*, 208*a* and 130, is larger than the thickness of the middle portion of the side wall spacer 150 in the height direction.

Figure 5B:
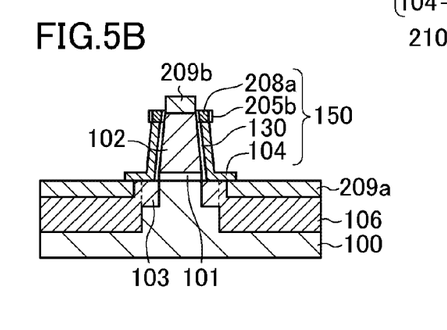

Next, as shown in FIG. 5B, using the side wall spacer 150 as a mask, a silicide layer 209*a* made of nickel silicide is formed on the deep source/drain region 106, and a silicide layer 209*b* made of nickel silicide is formed on the gate electrode 102. In this process, the structure is formed so that the end portion of the silicide layer 209a closer to the gate electrode 102 is, for example, 2 nm inward (toward the gate electrode 102) from the end portion of the side wall spacer 150 (the side wall portion 104).

Figure 5C:
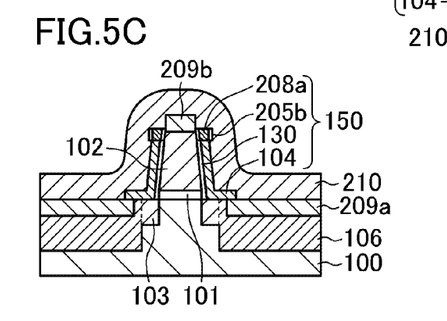

Next, as shown in FIG. 5C, a stress-applying insulating film 210 made of silicon nitride whose thickness is about 40 nm is deposited. Here, the stress-applying insulating film 210 applies a tensile stress in the channel length direction upon a channel region of the semiconductor substrate 100 that is formed directly under the gate electrode 102. This improves the mobility of the N-type MISFET.

Figure 5D:
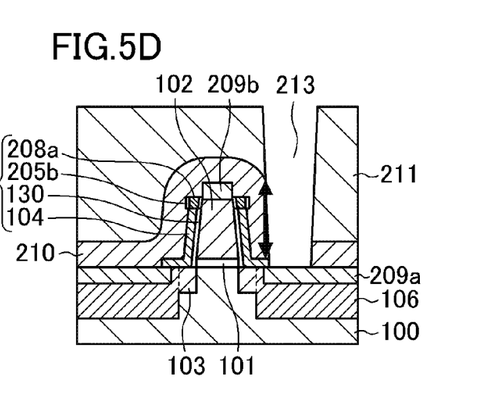

Next, as shown in FIG. 5D, an interlayer insulating film 211 made of silicon oxide is formed on the gate electrode 102 and on the semiconductor substrate 100, and then a contact hole 213 is formed in the interlayer insulating film 211 reaching the silicide layer 209a by dry etching using a patterned resist. In this process, first, the interlayer insulating film 211 is etched using the stress-applying insulating film 210 as an etching stopper, and then the stress-applying insulating film 210 is etched. Thereafter, the resist is peeled off.

Figure 5E:
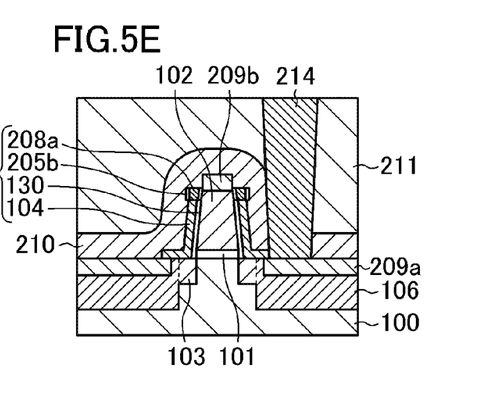

Next, as shown in FIG. 5E, a metal such as tungsten is buried in the contact hole 213 by a known method, thereby forming a contact plug 214 connected to the silicide layer 209a.

The total thickness of the side wall portion 208a and the side wall portion 205b on (both) side surfaces thereof formed by the method described above can be larger than the total thickness of the side wall portion 104 and the side wall portion 130 at least by 2 nm or more. Therefore, even if the resist opening position is shifted toward the gate electrode 102 from the predetermined position when forming the contact hole 213, the thickness of the stress-applying insulating film 210 in the height direction can be made sufficient as an etching stopper. Therefore, where the gate electrode 102 is tapered, even if the mask is misaligned in the lithography step when forming the contact hole, it is possible to reduce the amount of the semiconductor substrate 100 to be overly etched in the dry etching step. Even if the position of the resist is shifted from the silicide layer 209a, it is possible to prevent the contact hole 213 from being formed on the shallow source/drain region 103, and to reduce an increase in the contact resistance. As described above, with the manufacturing method of the present embodiment, even if the position of the contact plug 214 is shifted, it is possible to reduce the occurrence of problems such as an increase in the leak current or an increase in the resistance, and it is possible to manufacture a semiconductor device with low power consumption with high production yield.

As shown in FIG. 5E, a semiconductor device manufactured by the above method includes the semiconductor substrate 100, the gate electrode 102 formed on the semiconductor substrate 100 with the gate insulating film 101 interposed therebetween, the side wall spacer 150 formed on the side wall of the gate electrode 102, the deep source/drain regions 106 formed in opposing portions of the semiconductor substrate 100 with the gate electrode 102 and the side wall spacer 150 interposed therebetween, and the stress-applying insulating film 210 covering the gate electrode 102, the side wall spacer 150 and the upper surface of the semiconductor substrate 100. The thickness of an upper portion of the side wall spacer 150 in the height direction is at least larger than the thickness of the middle portion thereof in the height direction.

The side wall spacer 150 includes the side wall portion 104 formed on the side wall of the gate electrode 102 and on the semiconductor substrate 100 and having an L-shaped cross section, the side wall portion 208a formed on the side wall portion 104, and the side wall portion 205b formed on the side surface of the side wall portion 208a. The total thickness of the side wall portion 208a and the side wall portion 205b formed on (both) side surfaces thereof is larger than the thickness of the middle portion of the side wall portion 104 in the height direction.

Where the side wall portion 130 is further provided on the side wall of the gate electrode 102, the total thickness of the side wall portion 208a and the side wall portion 205b formed on (both) side surfaces thereof is larger than the total thickness of the side wall portion 130 and the middle portion of the side wall portion 104 in the height direction.

With the method of this variation, the mask used in the step of forming the silicide layers 209a and 209b can be used as the silicon oxide 208 forming the side wall portion 208a, thereby preventing an increase in the number of steps as compared with the method for manufacturing a conventional semiconductor device.

Note that while this variation is directed to an example where the side wall portion 130 is formed on the side wall of the gate electrode 102 in the step shown in FIG. 4A, the side wall portion 130 is not necessary, and may be absent.

Note that in the method of this variation, the silicide layers 209a and 209b may be formed after the formation of the side wall portions 205b and 208a and before the removal of the side wall portion 105.

While this variation is directed to an example where the MISFET is of an n-channel type, the MISFET may be of a p-channel type, and the shallow source/drain region 103 and the deep source/drain region 106 may be of a p type. In such a case, the stress-applying insulating film 210 is formed so as to apply a compressive stress in the channel length direction upon the channel region.

Note that the embodiment and the variations thereof described above are illustrative of the present invention, and changes may be made without departing from the scope of the present invention in terms of materials, thicknesses and heights of various portions, positions of contact holes, ion implantation conditions, etc.

As described above, the semiconductor device according to an example of the present invention is useful for improving the reliability of various electronic devices as it reduces the increase in the leak current and the resistance.

What is claimed is:

1. A semiconductor device comprising:
 a semiconductor substrate;
 a gate electrode formed on the semiconductor substrate with a gate insulating film interposed therebetween;
 a side wall spacer formed on a side wall of the gate electrode;
 source/drain regions formed in opposing portions of the semiconductor substrate with the gate electrode and the side wall spacer interposed therebetween; and
 a stress-applying insulating film covering the gate electrode, the side wall spacer, and an upper surface of the semiconductor substrate,
 wherein
 the side wall spacer includes a first side wall portion formed on the side wall of the gate electrode and on the semiconductor substrate and having an L-shaped cross section, and a second side wall portion formed on an upper end portion of the first side wall portion and having a gate-length-direction thickness at least larger than a gate-length-direction thickness of a middle portion of the first side wall portion in the height direction, and
 the side wall spacer further includes a third side wall portion interposed between the first side wall portion and the side wall of the gate electrode.

2. A semiconductor device comprising:
a semiconductor substrate;
a gate electrode formed on the semiconductor substrate with a gate insulating film interposed therebetween;
a side wall spacer formed on a side wall of the gate electrode;
source/drain regions formed in opposing portions of the semiconductor substrate with the gate electrode and the side wall spacer interposed therebetween; and
a stress-applying insulating film covering the gate electrode, the side wall spacer, and an upper surface of the semiconductor substrate,
wherein the side wall spacer includes a first side wall portion formed on the side wall of the gate electrode and on the semiconductor substrate and having an L-shaped cross section, a second side wall portion formed on an upper end portion of the first side wall portion, and a third side wall portion formed on the side surface of the second side wall portion,
a total of a gate-length-direction thickness of the second side wall portion and that of the third side wall portion formed on the side surface of the second side wall portion is larger than a gate-length-direction thickness of a middle portion of the first side wall portion in the height direction, and
the side wall spacer further includes a fourth side wall portion interposed between the first side wall portion and the side wall of the gate electrode.

3. The semiconductor device of claim 1, wherein the side wall of the gate electrode has a tapered shape.

4. The semiconductor device of claim 1, further comprising a silicide layer formed on the source/drain region.

5. The semiconductor device of claim 4, further comprising:
an interlayer insulating film formed on the stress-applying insulating film; and
a contact plug running through the interlayer insulating film and reaching the silicide layer.

6. The semiconductor device of claim 1, wherein the source/drain region is of an n type.

7. The semiconductor device of claim 6, wherein the stress-applying insulating film applies a tensile stress in a channel length direction upon a channel region of the semiconductor substrate located under the gate electrode.

8. A semiconductor device comprising:
a semiconductor substrate;
a gate electrode formed on the semiconductor substrate with a gate insulating film interposed therebetween;
a side wall spacer formed on a side wall of the gate electrode;
source/drain regions formed in opposing portions of the semiconductor substrate with the gate electrode and the side wall spacer interposed therebetween; and
a stress-applying insulating film covering the gate electrode, the side wall spacer, and an upper surface of the semiconductor substrate,
wherein a gate-length-direction thickness of an upper portion of the side wall spacer in a height direction is at least larger than a gate-length-direction thickness of a middle portion thereof in the height direction, and
a gate-length-direction thickness of a portion of the side wall spacer in contact with the side wall of the gate electrode increases from a middle portion toward a lower portion in the height direction.

9. The semiconductor device of claim 2, wherein the side wall of the gate electrode has a tapered shape.

10. The semiconductor device of claim 2, further comprising a silicide layer formed on the source/drain region.

11. The semiconductor device of claim 10, further comprising:
an interlayer insulating film formed on the stress-applying insulating film; and
a contact plug running through the interlayer insulating film and reaching the silicide layer.

12. The semiconductor device of claim 2, wherein the source/drain region is of an n type.

13. The semiconductor device of claim 12, wherein the stress-applying insulating film applies a tensile stress in a channel length direction upon a channel region of the semiconductor substrate located under the gate electrode.

14. The semiconductor device of claim 8, wherein the side wall of the gate electrode has a tapered shape.

15. The semiconductor device of claim 8, further comprising a silicide layer formed on the source/drain region.

16. The semiconductor device of claim 15, further comprising:
an interlayer insulating film formed on the stress-applying insulating film; and
a contact plug running through the interlayer insulating film and reaching the silicide layer.

17. The semiconductor device of claim 8, wherein the source/drain region is of an n type.

18. The semiconductor device of claim 17, wherein the stress-applying insulating film applies a tensile stress in a channel length direction upon a channel region of the semiconductor substrate located under the gate electrode.

* * * * *